(12) United States Patent
Moon

(10) Patent No.: US 6,873,189 B2
(45) Date of Patent: Mar. 29, 2005

(54) I/O BUFFER CIRCUIT

(75) Inventor: Hong-Shik Moon, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/349,008

(22) Filed: Jan. 22, 2003

(65) Prior Publication Data

US 2003/0137327 A1 Jul. 24, 2003

(30) Foreign Application Priority Data

Jan. 24, 2002 (KR) ................................. 10-2002-0004212

(51) Int. Cl.[7] .............................................. H03K 3/00
(52) U.S. Cl. ........................ 327/108; 327/333; 326/62; 326/81
(58) Field of Search ......................... 327/108–112, 170, 327/333; 326/21, 27, 62, 63, 80, 81

(56) References Cited

U.S. PATENT DOCUMENTS 5,467,031 A * 11/1995 Nguyen et al. ............... 326/81
5,781,026 A    7/1998 Chow
6,262,599 B1   7/2001 Coughlin, Jr. et al.
6,611,155 B2 *  8/2003 Sterrantino ................... 326/86

OTHER PUBLICATIONS

Hyun Lee, "CMOS I/O Transceiver With 3V/5V Level Converter and N–Tub Voltage Generator", ASIC Conference and Exhibit, 1993, Proceedings, 6th Annual IEEE International, pp. 444–447 (Sep., 1993).

* cited by examiner

Primary Examiner—Kenneth B. Wells
(74) Attorney, Agent, or Firm—Lee, Hong, Degerman, Kang & Schmadeka

(57) ABSTRACT

In an I/O buffer circuit for solving problems occurred due to I/O voltage level difference, the I/O buffer circuit includes a logical controller for generating an enable signal and data according to an internal core voltage (VDDC); a level converter for converting the internal core voltage (VDDC) into an output voltage level when the internal core voltage (VDDC), an input signal voltage (VDDI) and an output signal voltage (VDDO) are different; and a pull-up unit for permitting a voltage level in specific level order through the level converter when a power voltage level in a semiconductor chip and a voltage level of an input signal are different from each other.

18 Claims, 2 Drawing Sheets

I/O BUFFER CIRCUIT

BACKGROUND OF THE INVENTION

1. Field of the Invention

The present invention relates to an I/O (input/output) buffer, and in particular to an I/O buffer circuit which is capable of permitting a voltage level in specific level order when voltage levels of input and output signals are different from each other.

2. Description of the Prior Art

With the development of semiconductor fabrication techniques, a size of a semiconductor device has been reduced, and accordingly a level of power voltage supplied to a semiconductor chip for operating an IC (integrated circuit) has been lowered gradually.

On the other hand, input/output with the conventional semiconductor chip operated in a comparatively high power voltage level is requested continually. In particular, because a semiconductor chip using a core power voltage level and an output power voltage level differently has came into the market, it is required to solve problems caused by difference between an input signal level and an output signal level.

For example, in one semiconductor chip, a core voltage level as 1.8V or 1.5V is used, a voltage level of an output signal is 2.5V or 3.3V, an input/output (hereinafter, it is referred to an I/O) buffer for receiving a 5V signal from a bi-directional I/O node is necessary. In that case, the I/O buffer simultaneously requires a function for permitting an external input signal in a level higher than an output signal level and a function for converting a core signal in a level lower than an output signal level into an output voltage signal level. Recently, various circuits for performing these functions have been presented, and most circuits are for solving problems occurred when an input signal level is higher than an output signal level. First, in order to describe those problems, FIG. 1 illustrates a general I/O buffer circuit, and FIG. 2 illustrates the conventional I/O buffer circuit for solving the problems.

FIG. 1 is an exemplary view illustrating a general I/O buffer circuit.

Hereinafter, the operation of the I/O buffer circuit in FIG. 1 will be described.

First, in a CMOS process, FIG. 1 shows a N-well usage method for implementing a p-mos transistor onto a p-substrate. In order to support a bi-directional I/O, a tri-state buffer for operating an output signal level as a "high" or a "low" state in an output mode (EN: logic "high") and operating an output node as a high impedance state in an input mode (EN: logic "low") is mainly used. Herein, when a voltage level of a power terminal (VDDO) connected to a p-mos transistor (MP11) of the last output block determining a level of an output signal is lower than a level of a logic "high" voltage (VDDI), the p-mos transistor (MP11) has to be turned off so as to be in a high impedance state.

However, because the same level voltage (VDDO) with the output signal is applied to a gate of the p-mos transistor (MP11), the p-mos transistor (MP11) is turned on, and accordingly current of a signal applied from an I/O node is leaked to the power terminal (VDDO).

In addition, in most cases, because the N-well is connected to the power terminal (VDDO), forward bias is generated in a drain of the p-mos transistor (MP11), a p-diffusion region forming a source and the N-well as a bulk of the p-mos transistor (MP11), power is supplied to other parts due to current leakage caused by the forward bias, and accordingly a level of the power voltage may be varied.

In order to solve the above-mentioned problem, FIG. 2 illustrates an example of a circuit for floating the N-well bias.

FIG. 2 is an exemplary view illustrating another I/O buffer circuit in accordance with the conventional art.

Hereinafter, the conventional I/O buffer circuit will be described in detail with reference to accompanying drawings.

In a high impedance state for receiving an input signal through an I/O node, a "high" voltage is supplied to a gate of a p-mos transistor (MP21), and a "low" voltage is supplied to a gate of a n-mos transistor (MN21). Herein, a power voltage for determining a voltage level of an output signal is called VDDO, a power voltage for determining a voltage level of an input signal is called VDDI, if the VDDI is higher than the VDDO, because a level of the voltage applied to the gate of the p-mos transistor (MP21) is lower than the VDDI, the p-mos transistor (MP21) is turned on, and accordingly current flows in the VDDO direction. Herein, a p-mos transistor (MP22) performs a function for preventing the above-mentioned problem.

A gate of the p-mos transistor (MP22) is connected to the VDDO, a drain of the p-mos transistor (MP22) is connected to the I/O node. When a level of an input signal supplied to the I/O node is higher than a voltage of the VDDO, the p-mos transistor (MP22) is turned on. Herein, because the VDDI is applied to the gate of the p-mos transistor (MP21) connected to a source of the p-mos transistor (MP22), it is possible to prevent the p-mos transistor (MP21) from being turned on, and accordingly a current path through the p-mos transistor (MP21) is cut off.

In addition, a p-mos transistor (MP23) performs a function for preventing forward bias between a p-diffusion region of the drain of the p-mos transistor (MP21) and a PN-junction of the N-well as the bulk of the p-mos transistor (MP21).

The source of the p-mos transistor (MP22) is connected to a gate of the p-mos transistor (MP23), the VDDO is connected to the source of the p-mos transistor (MP23), and accordingly the N-well as the bulk is connected to the drain of the p-mos transistor (MP23). Accordingly, when the p-mos transistor (MP22) is turned on, the VDDI is applied to the gate of the p-mos transistor (MP23), and accordingly the N-well bias is cut off.

Because the gate of the p-mos transistor (MP23) is commonly connected with the gate of the p-mos transistor (MP21), when only the p-mos transistor (MP21) is turned on, the p-mos transistor (MP23) is turned on, and the VDDO voltage bias is generated in the N-well.

However, when the p-mos transistor (MP21) is turned off, the bias voltage is not applied to the N-well including the p-mos transistor (MP23), the p-mos transistor (MP21) and the p-mos transistor (MP22). In more detail, the N-well bias is floating.

When the p-mos transistor (MP22) is turned on, a n-mos transistor (MN22) performs a function for preventing a high voltage in the VDDI level from being applied to the internal circuit (a circuit using a power voltage lower than the VDDO such as the ND21). In more detail, because a gate of the n-mos transistor (MN22) is connected to the VDDO, a voltage level appliable to the internal side is limited so as to be not higher than the voltage level of the VDDO, and accordingly the internal circuit can be protected. Herein, when a voltage level lower than a VDDO voltage level as an I/O buffer output signal level is used for a voltage level (VDDC) of the internal core, because the p-mos transistor (MP21) can not be totally cut off, a function for changing different voltage level is required. However, the circuit shown in FIG. 2 can not solve the problem of the circuit in FIG. 1 and can not implement a function for increasing a voltage level by changing different voltage level.

As described above, in the conventional c-mos I/O buffer, it is possible to prevent current leakage through a p-mos transistor connected to an I/O node. Herein, when a voltage level lower than a level of a power terminal voltage as an output signal level of an I/O buffer is used as an internal core voltage, because a p-mos transistor connected to the I/O node can not be totally turned off, a function for changing a voltage level is required, however, the conventional art can not satisfy that request.

SUMMARY OF THE INVENTION

In order to solve the above-mentioned problem, it is an object of the present invention to provide a CMOS I/O buffer circuit which is capable of permitting a voltage level in the order of an internal supply voltage<an output signal voltage<an input signal voltage when a supply voltage level (VDDC) inside a semiconductor chip, an input signal voltage level (VDDI) and an output signal voltage level (VDDO) are all different.

It is another object of the present invention to provide a CMOS I/O buffer which is capable of permitting a high voltage input signal.

In order to achieve the above-mentioned objects, an I/O buffer circuit in accordance with the present invention includes a logical controller for generating an enable signal and data according to an internal core voltage (VDDC); a level converter for converting the internal core voltage (VDDC) into an output voltage level when the internal core voltage (VDDC), an input signal voltage (VDDI) and an output signal voltage (VDDO) are different; and a pull-up unit for permitting a voltage level in specific level order through the level converter when a power voltage level in a semiconductor chip and a voltage level of an input signal are different from each other.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
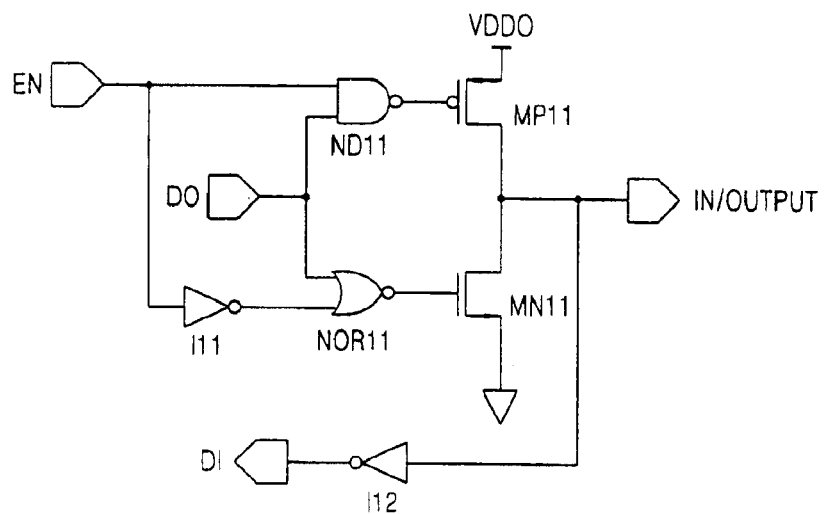
FIG. 1 is an exemplary view illustrating an I/O (input/output) buffer circuit in accordance with the conventional art.
Figure 2:
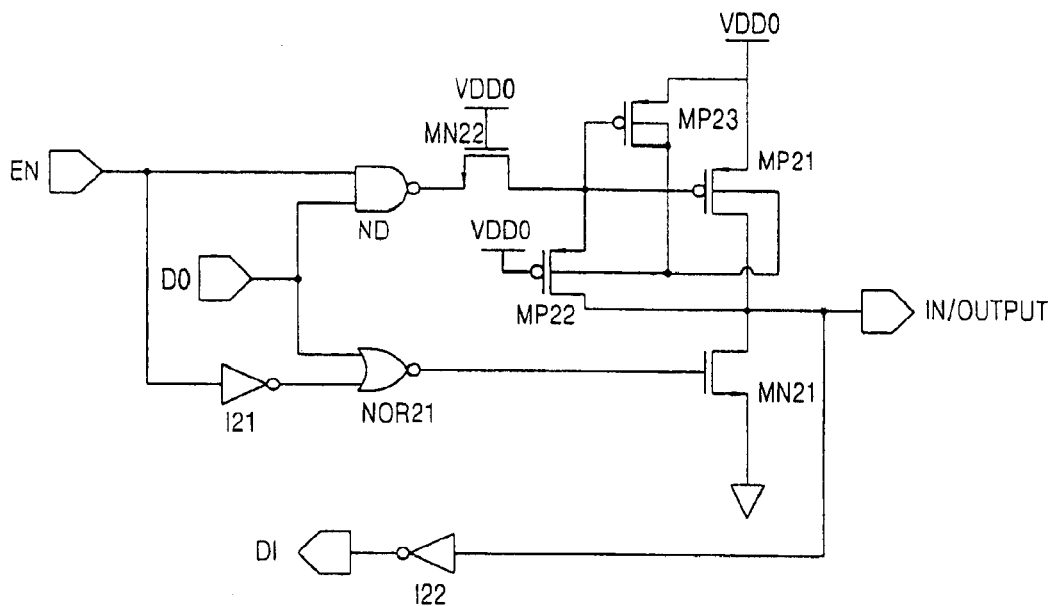
FIG. 2 is an exemplary view illustrating another I/O buffer circuit in accordance with the conventional art.
Figure 3:
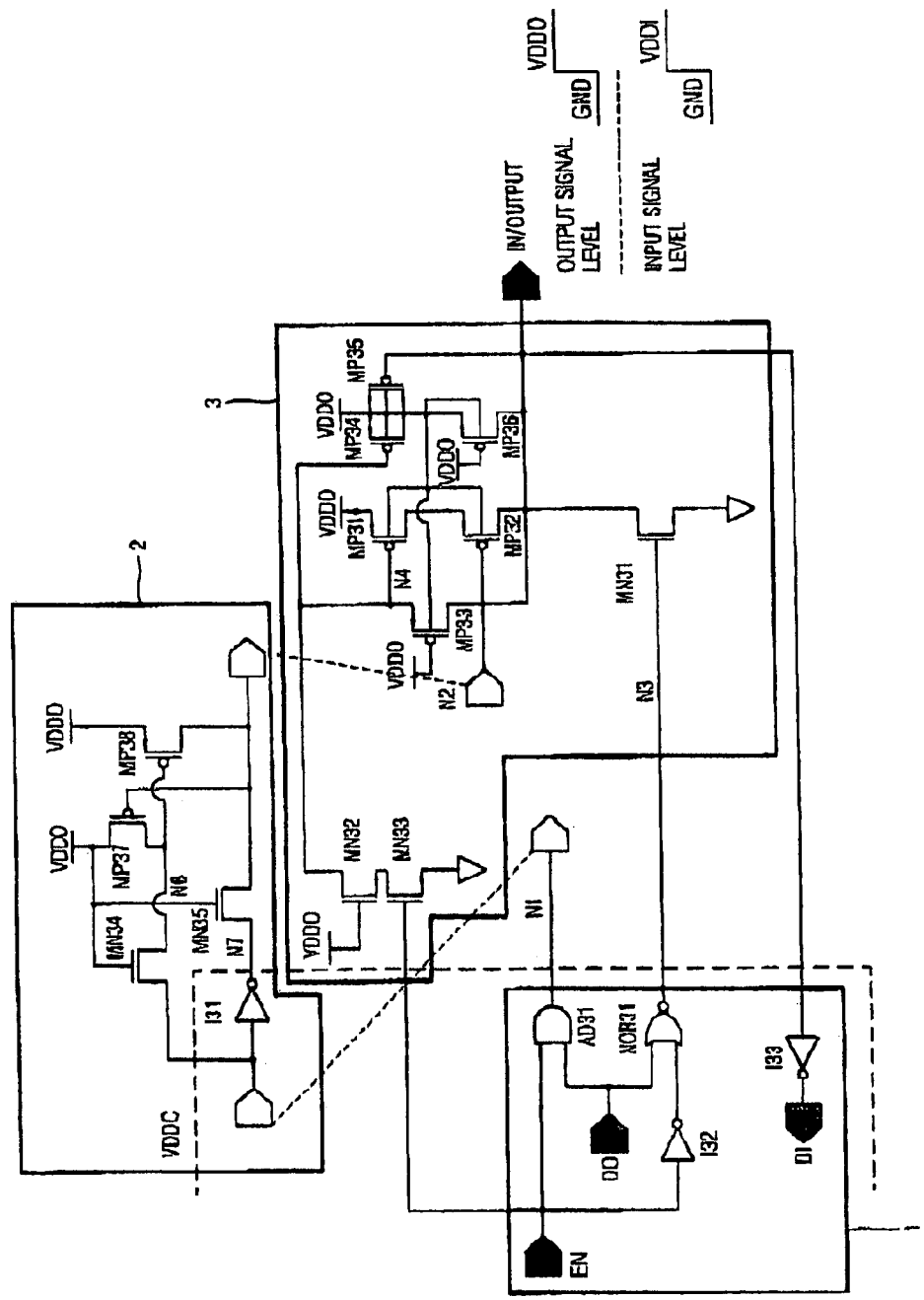
FIG. 3 is an exemplary view illustrating an I/O buffer circuit in accordance with the present invention.

FIG. 3 is an exemplary view illustrating an I/O buffer circuit in accordance with the present invention.

As depicted in FIG. 3, an I/O buffer circuit in accordance with the present invention includes a logical controller 1 for generating an enable signal (EN) and data (DO) according to an internal core voltage (hereinafter, it is referred to VDDC); a level converter 2 for converting the VDDC into an output voltage level when the VDDC, an input signal voltage (hereinafter, it is referred to VDDI) and an output signal voltage (hereinafter, it is referred to VDDO) are all different; and a pull-up unit 3 for making an I/O node into a logic "high" (VDDO) or a logic "low" (GND) state in an output mode, receiving an input signal in an input mode by making the I/O node into a high impedance state, cutting off a forward bias voltage between a P-diffusion region of a p-mos transistor and a N-well by totally turning-off the p-mos transistor for pull-up when a VDDI level is higher than a VDDO level, and applying a VDDO to the N-well as a bulk of each p-mos transistor of an output block when the VDDI level is logic "low" (GND=0[V]).

The operation of the I/O buffer in accordance with the present invention will be described in more detail.

FIG. 3 shows a bi-directional CMOS I/O buffer in accordance with the present invention. In an output mode, an I/O node is in a logic "high" (VDDO) or a logic "low" (GND) state. And, in an input mode, the I/O node is in a high impedance state in order to receive a signal.

The enable signal (EN) for controlling output of the data (DO) performs pull-up of the I/O node in a VDDO level, or performs pull-down (GND) of the I/O node. And, the logical controller 1 for generating the enable signal (EN) and the data (DO) is operated by the VDDC. Herein, the VDDC has a value lower than a VDDO level.

In the circuit, the VDDC, the VDDO and the VDDI are all different as VDDC<VDDO<VDDI. If a VDDC level and a VDDO level are the same, the level converter 2 is unnecessary.

With an example of a CMOS process for fabricating a p-mos transistor and a n-mos transistor by forming a N-well onto a general P-substrate, the detailed operation of the circuit will be described.

First, an operation for converting the I/O node into a logic "high" (VDDO) state in an output mode will be described.

In order to make the I/O node into the logic "high" output state, a n-mos transistor (MN31) for performing pull-down of the I/O node has to be turned off, and p-mos transistors (MP31), (MP32) for performing pull-up of the I/O node have to be turned on.

In addition, in order to make the I/O node into the logic high (VDDO) state, the enable signal (EN) is supplied as "high" state, and simultaneously the data (DO) signal is supplied as logic "high" state. Herein, a first node (N1) has to maintain a VDDC level as logic "high", and a third node (N3) has to maintain a GND level as logic "low" state. Then, because the first node (N1) is in the logic "high" state, a seventh node (N7) is reversed into a logic "low" state, the logic "low" signal is transmitted to the second node (N2) through a n-mos transistor (MN35), a p-mos transistor (MP37) is turned on, and accordingly a sixth node (N6) is converted into a logic "high" (VDDO) state. Therefore, a p-mos transistor (MP38) is totally turned off, and the p-mos transistor (MP32) is turned on by the logic "low" signal of the second node (N2).

Gate of n-mos transistors (MN34), (MN35) connected to the VDDO terminal performs a function for preventing the VDDO higher than the VDDC from being applied to the first node (N1) and the seventh node (N7). In addition, in order to make the I/O node in the logic "high" (VDDO) state, the p-mos transistor (MP31) has to be turned on, because an output signal can be in the logic "high" state only when both the enable signal (EN) and the data (DO) are in the logic "high" state, the p-mos transistor (MN33) in which the gate thereof is connected to the enable signal (EN) is turned on, a voltage level of the fourth node (N4) is logic "low" (GND), and the p-mos transistor (MP31) is turned on.

Herein, the VDDO is supplied to the N-well bias on which the p-mos transistors (MP31~MP33, MP34~MP36) are arranged through the p-mos transistor (MP34) turned on by the logic "low" of the fourth node (N4). As described above, if the VDDO level and the VDDC level are the same, because the level converter 2 is unnecessary, it can be eliminated.

In the meantime, in the output mode, the operation for operating the I/O node in the logic "low" (GND) state will be described.

In order to make the I/O node in the logic "low" output state, the p-mos transistors (MP31) (MP32) are turned off, and the n-mos transistor (MN31) for pull-down is turned on. Only when the enable signal (EN) is supplied as logic "high" and the data (DO) signal is logic "low", the I/O node is in the logic "low" state. Herein, the first node (N1) maintains a GND level as logic "low", and the third node (N3) maintains a VDDC level as logic "high".

Afterward, because the n-mos transistor (MN31) in which the gate thereof is connected with the third node (N3) as logic "high" (VDDC) is turned on, the I/O node is logic "low" (GND). Herein, in order to improve pull-down performance of the n-mos transistor (MN31), there is a need to operate a voltage level of the fourth node (N4) as the VDDO level, a general level shifter circuit using the VDDO can be added between the gate of the n-mos transistor (MN31) and the fourth node (N4).

Because the first node (N1) is in the logic "low" state, the "low" signal is transmitted to a sixth node (N6) through the n-mos transistor (MN34). Afterward, because the n-mos transistor (MP38) is turned on, the second node (N2) is converted into the logic "high" (VDDO) state. Accordingly, the p-mos transistor (MP37) is totally turned off, and the p-mos transistor (MP32) is turned off by the logic "high" signal of the second node (N2).

Because the p-mos transistor (MP31) maintains the turn-on state continually when the enable signal (EN) is logic "high", the current route between the I/O node and the VDDO terminal is cut off by the turn-off of the p-mos transistor (MP32). Herein, alike a case when the I/O node is in the logic "high" state, the VDDO is supplied to the bias voltage of the N-well on which the p-mos transistors (MP31~MP36) are arranged through the p-mos transistor (MP34) turned on by the logic "low" of the fourth node (N4) and the p-mos transistor (MP35) turned on by the logic "low" of the I/O node.

Last, the operation in an input mode will be described.

In order to receive a signal from the I/O node, the I/O node has to be in a high impedance state by disabling a function for pull-up or pull-down. When the enable signal (EN) is in the logic "low" state, the second node (N2) is in the logic "high" state, and the third node (N3) is in the logic "low" state through the above-mentioned process, and accordingly the p-mos transistor (MP32) and the n-mos transistor (MN31) are turned off. Herein, by the enable signal (EN) in the logic "low" state, the n-mos transistor (MN33) is turned off, and the fourth node (N4) is in the floating state, and accordingly the p-mos transistors (MP31), (MP34) are turned off.

In a general bi-directional c-mos I/O buffer, when a VDDI level is higher than a VDDO level, because forward bias voltage is applied between the P-diffusion region as a drain (or source) of the p-mos transistor and the N-well as the bulk of the p-mos transistor, it is impossible to cut off the p-mos transistor arranged in the pull-up portion perfectly, and accordingly current by an input signal may leak toward the VDDO terminal.

In FIG. 3, because a voltage level of the second node (N2) is the VDDO, when a VDDI level is higher than a VDDO level, the p-mos transistor (MP32) may be turned on. However, because the VDDI is applied to the fourth node (N4) connected to the gate of the p-mos transistor (MP31) through the p-mos transistor (MP33) in which the gate thereof is connected to the VDDO, the p-mos transistor (MP31) is turned off perfectly.

In addition, in order to cut off the forward bias voltage between the P-diffusion region of the p-mos transistor and the N-well, the VDDI is applied to the N-well through the p-mos transistor (MP36) in which the gate thereof is connected to the VDDO. In more detail, because the p-mos transistor (MP36) is turned on, the VDDI is applied to the N-well as the bulk of the p-mos transistors (MP31~MP36).

When the VDDI level is logic "low" (GND=0[V]), because the p-mos transistor (MP35) in which the gate thereof is connected to the I/O node is turned on, the VDDO is applied to the N-well as the bulk of the p-mos transistors (MP31~MP36).

As described above, when the VDDC level and the VDDO level are the same, by eliminating the level converter 2, the operation in a case when a VDDI is higher than a VDDO can be permitted. Herein, an input circuit receiving an input signal can be described as an inverter 133.

As described above, in the present invention, by using a level converter, it is possible to solve problems occurred in various power voltages in a semiconductor chip while permitting a high voltage input due to power voltage difference between semiconductor chips.

In addition, it is possible to provide a bi-directional c-mos I/O buffer required for a semiconductor chip having not a fixed power voltage level but difference power voltage levels.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A bi-directional I/O buffer circuit, comprising:
    a logical controller for receiving an enable signal and a data signal and outputting a voltage level of an internal core voltage (VDDC);
    a level converter for converting the voltage level of the internal core voltage (VDDC) into a voltage level of an output signal voltage (VDDO) when the internal core voltage (VDDC) is lower than the output signal voltage (VDDO) in a semiconductor chip in an output mode; and
    a pull-up unit for for receiving an input signal voltage (VDDI) when the input signal voltage (VDDI) is higher than the out signal voltage (VDDO) due to a power voltage difference between semiconductor chips in an input mode.

2. The circuit of claim 1, wherein the pull-up unit receives an input signal (VDDI) making an I/O node in a high impedance state in an input mode when the power voltage level in the semiconductor chip and the voltage level of the input signal are different from each other.

3. The circuit of claim 1, wherein the level converter is eliminated when an output signal voltage (VDDO) level and an internal core voltage (VDDC) level are the same.

4. The circuit of claim 1, wherein an output node of the logical controller (first node) is connected to an input node of the pull-up unit (second node) through an inverter and a n-mos transistor, an output signal voltage (VDDO) terminal is respectively connected to gates of n-mos transistors and sources of p-mos transistors, the output node (first node) is connected to a drain of the p-mos transistor and a gate of the p-mos transistor, and the input node (second node) is connected to a gate of the p-mos transistor and a drain of the p-mos transistor.

5. The circuit of claim 1, wherein the pull-up unit turns off a p-mos transistor totally by applying the input signal voltage (VDDI) to a node (fourth node) connected to a gate of a p-mos transistor through a p-mos transistor connected to the output signal voltage(VDDO) terminal when an input signal voltage (VDDI) level is higher than the output signal voltage (VDDO) level.

6. The circuit of claim 1, wherein the pull-up unit applies the input signal voltage (VDDI) to a N-well through a p-mos transistor connected to the output signal voltage (VDDO) terminal in order to cut off a forward bias voltage between a P-diffusion region of the p-mos transistor and the N-well.

7. The circuit of claim 1, wherein the pull-up unit applies the output signal voltage (VDDO) to the N-well as a bulk of p-mos transistors by turning on a p-mos transistor connected to an I/O node when the input signal voltage (VDDI) level is logic "low" (GND=0[V]).

8. The circuit of claim 1, wherein the pull-up unit includes;
   a node (fourth node) connected to gates of the p-mos transistors and a source of the p-mos transistor, a n-mos transistor connected to the output signal voltage (VDDO) terminal, a n-mos transistor connected to an enable terminal and an I/O node through the p-mos transistor connected to the output signal voltage (VDDO) terminal;
   the output signal voltage (VDDO) terminal connected to the I/O node through the p-mos transistors and a grounding terminal through a n-mos transistor connected to an output node of the logical controller and the I/O node through p-mos transistors in which sources and drains are commonly connected and a p-mos transistor connected to the output signal voltage (VDDO) terminal; and
   a node (second node) connected to the gate of the p-mos transistor.

9. The circuit of claim 8, wherein the pull-up unit turns off the p-trios transistor totally by applying the input signal voltage (VDDI) to the node (fourth node) connected to the gate of the p-mos transistor through the p-mos transistor connected to the output signal voltage (VDDO) terminal.

10. The circuit of claim 8, wherein the pull-up unit applies the input signal voltage to the N-well through the p-mos transistor connected to the output signal voltage (VDDO) terminal in order to cut off a forward bias voltage between the P-diffusion region of the p-mos transistor and the N-well.

11. The circuit of claim 8, wherein the pull-up unit applies an output signal voltage (VDDO) to the N-well as a bulk of the p-mos transistors by turning on the p-mos transistor connected to the I/O node when an input signal voltage (VDDI) is logic "low" (GND=0[V]).

12. A bi-directional I/O buffer circuit, comprising:
    a logical controller for receiving an enable signal and a data signal and outputting an internal core voltage (VDDC);
    a level converter for converting the voltage level of the internal core voltage (VDDC) into a voltage level of an output signal (VDDO) when the internal core voltage (VDDC) is lower than the output signal voltage (VDDO) in a semiconductor chip in an output mode; and
    a pull-up unit for making an I/O node in a high impedance state, and receiving an input signal voltage (VDDI) through the I/O node when the input signal voltage (VDDI) is higher than the output signal voltage (VDDO) due to a power voltage difference between semiconductor chips in an input mode.

13. The circuit of claim 12, wherein the level converter is eliminated when an output signal voltage (VDDO) level and an internal core voltage (VDDI) level are the same.

14. The circuit of claim 12, wherein an output node of the logical controller (first node) is connected to an input node of the pull-up unit (second node) through an inverter and a n-mos transistor, an output signal voltage (VDDO) terminal is respectively connected to gates of n-mos transistors and sources of p-mos transistors, the output node (first node) is connected to a drain of the p-mos transistor and a gate of the p-mos transistor, and the input node (second node) is connected to a gate of the p-mos transistor and a drain of the p-mos transistor.

15. The circuit of claim 12, wherein the pull-up unit turns off a p-mos transistor totally by applying an input signal voltage (VDDI) to a node (fourth node) connected to a gate of a p-mos transistor through a p-mos transistor connected to the output signal voltage (VDDO) terminal when an input signal voltage (VDDI) level is higher than an output signal voltage (VDDO) level.

16. The circuit of claim 12, wherein the pull-up unit applies the input signal voltage (VDDI) to a N-well through a p-mos transistor connected to the output signal voltage (VDDO) terminal in order to cut off a forward bias voltage between a P-diffusion region of the p-mos transistor and the N-well.

17. The circuit of claim 12, wherein the pull-up unit applies an output signal voltage (VDDO) to the N-well as a bulk of p-mos transistors by turning on a p-mos transistor connected to the I/O node when the input signal voltage (VDDI) level is logic "low" (GND=0[V]).

18. A bi-directional I/O buffer circuit, comprising:
    a level converter for converting a voltage level of an internal core voltage (VDDC) into a voltage level of an output voltage (VDDO) when the internal core voltage (VDDC) and the output signal voltage (VDDO) are different in an output mode; and
    a pull-up unit for receiving an input signal (VDDI), and permitting a voltage level change when the input signal voltage (VDDI) is higher than the output voltage (VDDO) due to a power voltage difference between semiconductor chips in an input mode.

* * * * *